United States Patent [19]

Creagh

[11] Patent Number: 4,511,598
[45] Date of Patent: Apr. 16, 1985

[54] ELECTROMECHANICAL TRANSDUCER PROTECTING

[75] Inventor: Linda T. Creagh, Argyle, Tex.

[73] Assignee: Xerox Corporation, Stamford, Conn.

[21] Appl. No.: 432,593

[22] Filed: Oct. 4, 1982

[51] Int. Cl.$^3$ .............................................. B05D 5/12
[52] U.S. Cl. ................................. 427/58; 346/140 R
[58] Field of Search ...................... 346/140 PD, 151; 427/58, 238, 294, 295, 435, 100, 443.2; 310/311, 313

[56] References Cited

U.S. PATENT DOCUMENTS

| 2,759,241 | 8/1956 | Sturm | 310/340 |
|---|---|---|---|
| 3,230,402 | 1/1966 | Nightingale | 310/340 |
| 3,360,665 | 12/1967 | Boswell | 310/340 |
| 4,173,593 | 11/1979 | Smith | 428/377 |
| 4,243,995 | 1/1981 | Wright et al. | 346/140 R |
| 4,303,927 | 12/1981 | Tsao | 346/75 |
| 4,308,546 | 12/1981 | Halasz | 346/140 R |
| 4,323,908 | 4/1982 | Lee | 346/140 PD |
| 4,326,205 | 4/1982 | Fischbeck | 346/140 PD |
| 4,330,593 | 5/1982 | Shrout | 427/100 |
| 4,335,389 | 6/1982 | Shirato | 346/140 PD |
| 4,389,587 | 6/1983 | Levine | 310/208 |
| 4,407,876 | 10/1983 | Otty | 428/102 |

OTHER PUBLICATIONS

Condensed Chemical Dictionary, Turner Editor, 1950, p. 593.

Primary Examiner—E. A. Goldberg
Assistant Examiner—M. Reinhart
Attorney, Agent, or Firm—Richard A. Tomlin

[57] ABSTRACT

An electromechanical transducer for an ink jet printer is vacuum impregnated with, e.g., epoxy or silicone materials. The impregnated transducer is less subject to chemical attack and to being shorted out by penetration by conductive inks.

1 Claim, 2 Drawing Figures

ELECTROMECHANICAL TRANSDUCER PROTECTING

This invention relates to pressure pulse ejectors and more specifically to a coated piezoelectric transducer for use in ink jet printers. Although the invention will be described in connection with drop-on-demand ink jet printers, it is to be understood that the invention may have utility in other pressure pulse ejector systems.

In conventional drop-on-demand ink jet ejectors, a meniscus of ink is formed across a small orifice. The ink is held in the ejector by the surface tension of the ink. A pressure pulse directed through the ink to the meniscus of sufficient energy will cause a droplet of ink to be formed and expelled at a velocity sufficient to impact a record surface to form a mark thereon. A well-known embodiment of such an ejector utilizes a tubular electromechanical transducer which surrounds a channel of ink. The electromechanical transducer is coated on its inner and outer surfaces with a conductive material. Upon application of a drive pulse to the electromechanical transducer, it contracts radially, applying a pressure pulse to ink in the ink channel, expelling a droplet from the ejector.

It has been found, depending on ink composition, that electromechanical transducers are attacked by the ink in one or more ways. First, if the ink is corrosive to the electromechanical transducer conductive coating, mechanical failure results. Second, preferred electromechanical transducer materials such as piezoelectric ceramic materials are porous and, even though coated with a metal, can be penetrated by the ink. If the ink is conductive, ink penetration can result in the shorting out of the transducer. Also, ink may penetrate across the ends of the transducer causing a short. These problems are overcome by coating the transducers utilizing the materials and techniques disclosed herein.

The invention can best be understood by reference to the Figures, especially when taken in conjunction with the following detailed disclosure, which describe a single preferred embodiment of this invention. The Figures are not drawn to scale; for example, the conductive layers and protective coatings are exaggerated in thickness to more clearly show their relative positions.

Referring now to the drawing.

Figure 1:
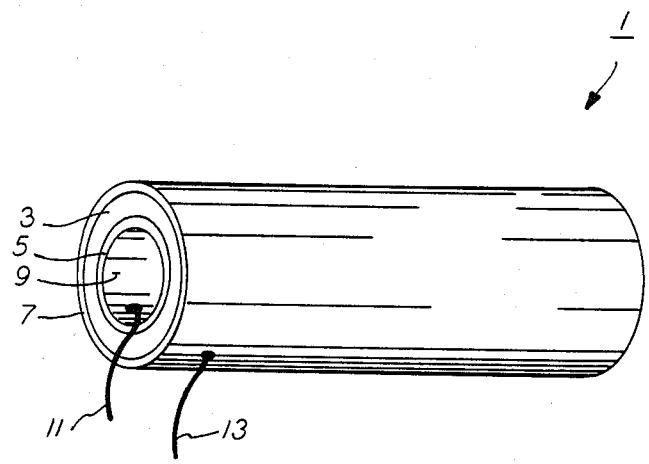
FIG. 1 shows a tubular electromechanical transducer having on its inner and outer surfaces a thin layer of a conductive material and electrical leads to the inner and outer surfaces.

Referring now to FIG. 1, there is seen an electromechanical transducer generally designated as 1, which, in this exemplary instance, comprises a piezoelectric ceramic tube 3 coated on the inner and outer surfaces with a thin conductive metallic layer 5 and 7, respectively. The hollow core of the tube forms the ink channel 9. Such electromechanical transducers 1 are available commercially. Electrical leads 11, 13 are connected to inner and outer conductive layers 5 and 7, respectively, and to a source of electrical potential (not shown).

In operation ink channel 9 is provided with ink by gravity or capillary forces. A drive pulse is applied to electrical leads 11 and 13, which causes a rapid change in the potential difference between conductive surfaces 5 and 7 and thus radially across piezoelectric member 3. The piezoelectric member 3 is radially polarized such that the rapid change in potential difference causes the electromechanical transducer to contract radially causing a pressure pulse to traverse the ink contained in channel 9. Transducers 1 conventionally are operated in the kHz range. Conductive surfaces 5 and 7 are by necessity very thin so that they do not interfere with the rapid oscillation of the piezoelectric member 3 or absorb a significant amount of the drive pulse energy. Surfaces 5 and 7 are conventionally electroplated nickel and are subject to pinhole leaks. Depending on the ink utilized, conductive surface 5 may be chemically attacked. Also, failure is sometimes caused by a conductive ink soaking into piezoelectric member 3 forming a conductive path between conductive surfaces 5 and 7 thereby "shorting out" the electromechanical transducer 1.

Figure 2:
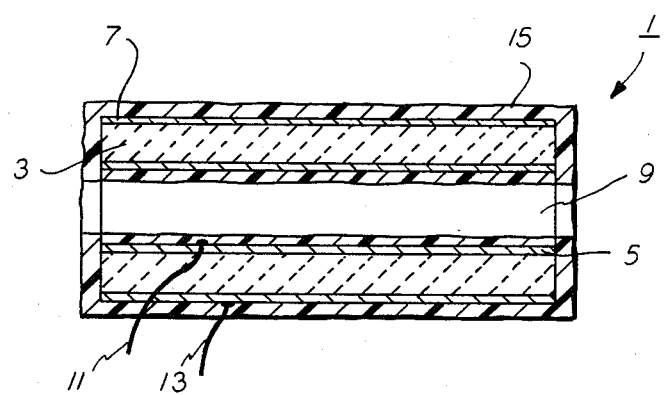
FIG. 2 shows a side-sectional view of the tubular electromechanical transducer of FIG. 1 after the transducer has been provided with a protective coating.

Referring now to FIG. 2, it has been found that these electromechanical transducer 1 failures can be reduced or prevented by providing a protective material, which not only coats but penetrates the piezoelectric member 3. It has been found that, by immersing the electromechanical transducer 1 into a container of insulating fluid and placing the container in a low pressure environment, the insulating fluid can be forced through the ends of piezoelectric member 3, filling the pores inherently present in piezoelectric member 3. The reduction of pressure causes any gases, e.g., air, to be removed from the pores in piezoelectric member 3. The gases are replaced with the insulating liquid. In order to act as a protective coating, the insulating fluid is selected from those materials which can be hardened upon drying or curing to form protective material 15. The protective material 15 of this invention, accordingly, not only coats electromechanical transducer 1 but also vacuum impregnates the otherwise porous piezoelectric member 3. This combination of coating and impregnation acts to prevent not only chemical attack on conductive surface 5 but also prevents conductive inks from forming a conductive path between electrode surfaces 5 and 7.

In an example, a tubular piezoelectric transducer 3, available as PZT 5A from Vernitron Company of Lake Success, N.Y., and having conductive surfaces 5, 7 of electrodeposited nickel on its surfaces, is provided with electrical leads 11, 13 as shown in FIGS. 1 and 2 and immersed in a container of Silastic J, a silicone available from Dow Corning, Midland, Mich. The container is placed in a vacuum chamber and subjected to reduced pressure for a time sufficient to remove entrained gases. The container is removed from the chamber, the electromechanical transducer 1 is removed from the container and allowed to drain. The silicone remaining on and within the electromechanical transducer is allowed to cure at room temperature forming a protective material 15, which material also penetrates the piezoelectric member 3. The tubular electromechanical transducer 1 has an inside diameter, before being vacuum impregnated, of about 0.03 inches, an outside diameter of about 0.05 inches and a length of about 0.6 inches. Coatings formed by the process described herein measure about 0.5 to 1.0 mil thick and thus do not significantly interfere with the operation of the electromechanical transducer 1. Other materials that have been successfully used as a protective material 15 include Silastic E, also available from Dow Corning, and an epoxy resin of Stycast 1267 with Catalyst LN1049-65A, both available from Emerson & Cuming, Inc., of Canton, Mass. The coating is cured by heating.

To test the coated electromechanical transducers, they are placed in the ink with which they are to be used and subjected to repeated drive pulse cycles. It has been found that the vacuum impregnated and overcoated electromechanical transducers 1 of this invention have an improved useful life in ink jet ejector service.

Although specific components and embodiments have been set out in the above description of preferred embodiments, other components and materials may be substituted where desired. It will be understood by one skilled in the art that various changes in the form and details may be made therein without departing from the spirit and scope of the invention as defined by the following claims.

What is claimed is:

1. A method for overcoating and impregnating an electroded porous electromechanical transducer comprising the steps of:
    (a) immersing said electroded porous electromechanical transducer in a container of insulating hardenable liquid,
    (b) subjecting said container to a reduced pressure until at least a portion of gases entrained in the voids of said porous electromechanical transducer are removed,
    (c) increasing the pressure on said container,
    (d) removing said transducer from said liquid,
    (e) allowing excess liquid to drain off of said transducer,
    (f) allowing said hardenable liquid to harden until a protective coating is formed on said transducer

* * * * *